US009039914B2

(12) United States Patent
Palanisamy Chinnathambi et al.

(10) Patent No.: US 9,039,914 B2
(45) Date of Patent: May 26, 2015

(54) POLISHING COMPOSITION FOR NICKEL-PHOSPHOROUS-COATED MEMORY DISKS

(75) Inventors: Selvaraj Palanisamy Chinnathambi, Jurong (SG); Haresh Siriwardane, Woodlands (SG)

(73) Assignee: Cabot Microelectronics Corporation, Aurora, IL (US)

( * ) Notice: Subject to any disclaimer, the term of this patent is extended or adjusted under 35 U.S.C. 154(b) by 203 days.

(21) Appl. No.: 13/478,292

(22) Filed: May 23, 2012

(65) Prior Publication Data

US 2013/0313226 A1 Nov. 28, 2013

(51) Int. Cl.
*B44C 1/22* (2006.01)
*C09K 3/14* (2006.01)
*H01L 21/321* (2006.01)
*H01L 21/306* (2006.01)

(52) U.S. Cl.
CPC ........... *C09K 3/1463* (2013.01); *H01L 21/3212* (2013.01); *H01L 21/30625* (2013.01); *B81C 2201/0104* (2013.01)

(58) Field of Classification Search
CPC  B81C 2201/0104; B24B 1/00; C09K 3/1463; H01L 21/3212; H01L 21/30625
USPC ................................. 216/89, 90, 91; 438/692
See application file for complete search history.

(56) References Cited

U.S. PATENT DOCUMENTS

| | | | |
|---|---|---|---|
| 5,196,353 A | 3/1993 | Sandhu et al. | |
| 5,230,833 A | 7/1993 | Romberger et al. | |
| 5,433,651 A | 7/1995 | Lustig et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,693,239 A | 12/1997 | Wang et al. | |
| 5,730,642 A | 3/1998 | Sandhu et al. | |
| 5,783,489 A | 7/1998 | Kaufman et al. | |
| 5,838,447 A | 11/1998 | Hiyama et al. | |
| 5,858,813 A | 1/1999 | Scherber et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 5,980,775 A | 11/1999 | Grumbine et al. | |
| 5,993,686 A | 11/1999 | Streinz et al. | |
| 6,033,596 A | 3/2000 | Kaufman et al. | |
| 6,039,891 A | 3/2000 | Kaufman et al. | |
| 6,068,787 A | 5/2000 | Grumbine et al. | |
| 6,139,763 A | 10/2000 | Ina et al. | |
| 6,149,696 A | 11/2000 | Jia | |
| 6,177,026 B1 | 1/2001 | Wang et al. | |
| 6,190,443 B1 | 2/2001 | Ohashi et al. | |
| 6,258,140 B1 * | 7/2001 | Shemo et al. | 51/308 |
| 6,280,490 B1 | 8/2001 | Rader et al. | |
| 6,300,249 B1 | 10/2001 | Yoshida et al. | |
| 6,313,039 B1 | 11/2001 | Small et al. | |
| 6,332,831 B1 | 12/2001 | Shemo et al. | |
| 6,350,393 B2 | 2/2002 | Francis et al. | |
| 6,376,381 B1 | 4/2002 | Sabde | |
| 6,395,194 B1 | 5/2002 | Russell et al. | |
| 6,428,721 B1 | 8/2002 | Ina et al. | |
| 6,429,133 B1 | 8/2002 | Chopra | |
| 6,432,828 B2 | 8/2002 | Kaufman et al. | |
| 6,435,944 B1 | 8/2002 | Wang et al. | |
| 6,439,965 B1 | 8/2002 | Ichino et al. | |
| 6,440,186 B1 | 8/2002 | Sakai et al. | |
| 6,447,563 B1 | 9/2002 | Mahulikar | |
| 6,454,819 B1 | 9/2002 | Yano et al. | |
| 6,461,227 B1 | 10/2002 | Fang | |
| 6,468,137 B1 | 10/2002 | Fang et al. | |
| 6,468,913 B1 | 10/2002 | Pasqualoni et al. | |
| 6,471,735 B1 | 10/2002 | Misra et al. | |
| 6,471,884 B1 | 10/2002 | Fang et al. | |
| 6,488,729 B1 | 12/2002 | Ishitobi et al. | |
| 6,541,384 B1 | 4/2003 | Sun et al. | |
| 6,551,175 B2 | 4/2003 | Koichi et al. | |
| 6,569,215 B2 | 5/2003 | Miyata | |
| 6,569,216 B1 | 5/2003 | Taira et al. | |
| 6,579,923 B2 | 6/2003 | Yarmey et al. | |
| 6,604,987 B1 | 8/2003 | Sun | |

(Continued)

FOREIGN PATENT DOCUMENTS

| | | |
|---|---|---|
| EP | 1 580 248 A1 | 9/2005 |
| JP | 02-084485 A | 3/1990 |

(Continued)

OTHER PUBLICATIONS

Bielmann et al., "Enhanced Tungsten Chemical Mechanical Polishing Using Stable Alumina Slurries," *Electrochemical and Solid-State Letters*, 2(3): 148-150 (1999).
Chelating Agents: Their Structure and Properties, 1-5, http://www.westerhuis-restaurate.nl/pdf/chelating-agents.pdf (as provided with USPTO Office Action dated Jan. 30, 2012).
Katoh et al., "Effects of Abrasive Morphology and Surfactant Concentration on Polishing Rate of Ceria Slurry," *Japanese Journal of Applied Physics*, 42(Part 1, No. 3): 1150-1153 (2003).
Kim et al., "Effects of Chemicals and Slurry Particles on Chemical Mechanical Polishing of Polyimide," *Japanese Journal of Applied Physics*, 39(Part 1, No. 3A): 1085-1090 (2000).
Korean Intellectual Property Office, International Search Report in International Patent Application No. PCT/US2009/003955 (Feb. 22, 2010).

(Continued)

*Primary Examiner* — Binh X Tran
(74) *Attorney, Agent, or Firm* — Thomas E Omholt; Francis J Koszyk

(57) ABSTRACT

The invention provides a chemical-mechanical polishing composition containing wet-process silica, an oxidizing agent that oxidizes nickel-phosphorous, a chelating agent, polyvinyl alcohol, and water. The invention also provides a method of chemically-mechanically polishing a substrate, especially a nickel-phosphorous substrate, by contacting a substrate with a polishing pad and the chemical-mechanical polishing composition, moving the polishing pad and the polishing composition relative to the substrate, and abrading at least a portion of the substrate to polish the substrate.

14 Claims, No Drawings

(56) References Cited

U.S. PATENT DOCUMENTS

| | | |
|---|---|---|
| 6,607,571 B2 | 8/2003 | Ishitobi et al. |
| 6,620,037 B2 | 9/2003 | Kaufman et al. |
| 6,620,216 B2 | 9/2003 | Oshima et al. |
| 6,630,433 B2 | 10/2003 | Zhang et al. |
| 6,641,630 B1 | 11/2003 | Sun |
| 6,645,051 B2 | 11/2003 | Sugiyama et al. |
| 6,677,239 B2 | 1/2004 | Hsu et al. |
| 6,699,402 B2 | 3/2004 | Russell et al. |
| 6,749,488 B2 | 6/2004 | Pasqualoni et al. |
| 6,755,721 B2 | 6/2004 | Ward et al. |
| 6,818,031 B2 | 11/2004 | Oshima |
| 6,821,309 B2 | 11/2004 | Singh et al. |
| 6,896,591 B2 | 5/2005 | Chaneyalew et al. |
| 6,910,952 B2 | 6/2005 | Suenaga et al. |
| 6,936,543 B2 | 8/2005 | Schroeder et al. |
| 6,945,851 B2 | 9/2005 | Ward et al. |
| 6,976,905 B1 | 12/2005 | Fang et al. |
| 7,014,534 B2 | 3/2006 | Oshima et al. |
| 7,014,669 B2 | 3/2006 | Small et al. |
| 7,097,541 B2 | 8/2006 | DeRege Thesauro et al. |
| 7,147,682 B2 | 12/2006 | Oshima et al. |
| 7,153,335 B2 | 12/2006 | Siddiqui et al. |
| 7,220,676 B2 | 5/2007 | Hagihara et al. |
| 7,300,601 B2 | 11/2007 | Liu et al. |
| 7,419,911 B2 | 9/2008 | Chelle et al. |
| 7,442,645 B2 | 10/2008 | Carter et al. |
| 7,524,347 B2 | 4/2009 | Sun et al. |
| 7,550,388 B2 | 6/2009 | Oh et al. |
| 7,597,729 B2 | 10/2009 | Takami |
| 7,922,926 B2 | 4/2011 | Chinnathambi et al. |
| 2001/0049910 A1 | 12/2001 | Kaufman et al. |
| 2001/0051433 A1 | 12/2001 | Francis et al. |
| 2001/0051746 A1 | 12/2001 | Hagihara et al. |
| 2002/0168923 A1 | 11/2002 | Kaufman et al. |
| 2003/0040182 A1 | 2/2003 | Hsu et al. |
| 2003/0041526 A1 | 3/2003 | Fujii et al. |
| 2003/0051413 A1 | 3/2003 | Sakai et al. |
| 2003/0124959 A1 | 7/2003 | Schroeder et al. |
| 2003/0153184 A1 | 8/2003 | Wang et al. |
| 2003/0171072 A1 | 9/2003 | Ward et al. |
| 2003/0181142 A1 | 9/2003 | De Rege Thesauro et al. |
| 2003/0228763 A1 | 12/2003 | Schroeder et al. |
| 2004/0025444 A1 | 2/2004 | Small et al. |
| 2004/0092103 A1 | 5/2004 | Fujii et al. |
| 2004/0157535 A1 | 8/2004 | Chaneyalew et al. |
| 2004/0159050 A1 | 8/2004 | Pasqualoni et al. |
| 2004/0232379 A1 | 11/2004 | Ameen et al. |
| 2004/0266323 A1 | 12/2004 | Oshima et al. |
| 2005/0003746 A1 | 1/2005 | Fujii et al. |
| 2005/0009322 A1 | 1/2005 | Matsui et al. |
| 2005/0020187 A1 | 1/2005 | Ward et al. |
| 2005/0079803 A1 | 4/2005 | Siddiqui et al. |
| 2005/0090104 A1 | 4/2005 | Yang et al. |
| 2005/0132660 A1 | 6/2005 | Fujii et al. |
| 2005/0136807 A1 | 6/2005 | Kitayama et al. |
| 2005/0260390 A1 | 11/2005 | Croft et al. |
| 2005/0279030 A1 | 12/2005 | Ward et al. |
| 2005/0282387 A1 | 12/2005 | Sato et al. |
| 2006/0024967 A1 | 2/2006 | De Rege Thesauro et al. |
| 2006/0030155 A1 | 2/2006 | Kim et al. |
| 2006/0046490 A1 | 3/2006 | Banerjee et al. |
| 2006/0096496 A1* | 5/2006 | Sun et al. ............ 106/3 |
| 2006/0196850 A1 | 9/2006 | Roh et al. |
| 2006/0213868 A1 | 9/2006 | Siddiqui et al. |
| 2006/0243702 A1 | 11/2006 | Minamihaba et al. |
| 2007/0128873 A1 | 6/2007 | Minamihaba et al. |
| 2007/0167116 A1* | 7/2007 | Yoshida et al. ......... 451/41 |
| 2007/0178700 A1 | 8/2007 | Dysard et al. |
| 2007/0207617 A1 | 9/2007 | Hey et al. |
| 2007/0209288 A1 | 9/2007 | Ohta et al. |
| 2007/0224101 A1 | 9/2007 | Ohta et al. |
| 2007/0224919 A1 | 9/2007 | Li et al. |
| 2008/0210665 A1* | 9/2008 | Tamai et al. ............ 216/89 |
| 2008/0227370 A1 | 9/2008 | Fujii et al. |
| 2009/0068840 A1 | 3/2009 | Minamihaba et al. |
| 2009/0127501 A1 | 5/2009 | Kashima et al. |
| 2009/0173717 A1 | 7/2009 | Palanisamy Chinnathambi et al. |
| 2010/0009537 A1 | 1/2010 | Balasubramaniam et al. |
| 2010/0193470 A1 | 8/2010 | Palanisamy Chinnathambi et al. |

FOREIGN PATENT DOCUMENTS

| | | |
|---|---|---|
| JP | 09-316430 A | 12/1997 |
| JP | 2001-062704 A | 3/2001 |
| JP | 2004-204152 A | 7/2004 |
| JP | 2004-331886 A | 11/2004 |
| WO | WO 99/47618 A1 | 9/1999 |
| WO | WO 01/32793 A2 | 5/2001 |
| WO | WO 2004/033574 A1 | 4/2004 |
| WO | WO 2004/076574 A2 | 9/2004 |
| WO | WO 2006/049912 A2 | 5/2006 |
| WO | WO 2009/089026 A2 | 7/2009 |
| WO | WO 2010/005543 A2 | 1/2010 |
| WO | WO 2010/090928 A2 | 8/2010 |

OTHER PUBLICATIONS

Lin et al., "Effects of slurry components on the surface characteristics when chemical mechanical polishing NiP/A1 substrate," *Thin Solid Films*, 483: 400-406 (2005).

Mullany et al., "The effect of slurry viscosity on chemical-mechanical polishing of silicon wafers," *Journal of Materials Processing Technology*, 132: 28-34 (2003).

Palla et al., "Stabilization of Alumina Slurries in Presence of Oxidizers for Tungsten Chemical Mechanical Polishing," *Twenty Third IEEE/CPMT International Electronics Manufacturing Technology Symposium*, 155-163 (1998).

* cited by examiner

POLISHING COMPOSITION FOR NICKEL-PHOSPHOROUS-COATED MEMORY DISKS

BACKGROUND OF THE INVENTION

The demand for increased storage capacity in memory or rigid disks and the trend towards miniaturization of memory or rigid disks (due to the requirement for smaller hard drives in computer equipment) continues to emphasize the importance of the memory or rigid disk manufacturing process, including the planarization or polishing of such disks for ensuring maximal performance. While there exist several chemical-mechanical polishing (CMP) compositions and methods for use in conjunction with semiconductor device manufacture, few conventional CMP methods or commercially available CMP compositions are well-suited for the planarization or polishing of memory or rigid disks.

As the demand for increased storage capacity has increased, so has the need for improved processes for the polishing of such memory or rigid disks. The term "memory or rigid disk" refers to any magnetic disk, hard disk, rigid disk, or memory disk for retaining information in electromagnetic form. The memory or rigid disk typically has a surface that comprises nickel-phosphorus, but the memory or rigid disk surface can comprise any other suitable material. The planarity of the memory or rigid disks must be improved, as the distance between the recording head of a disk drive and the surface of the memory or rigid disk has decreased with improvements in recording density that demand a lower flying height of the magnetic head with respect to the memory or rigid disk. In order to permit a lower flying height of the magnetic head, improvements to the surface finish of the memory or rigid disk are required.

Improvements to the surface finish of the memory or rigid disk require that scratches and micro defects caused by abrasive particles must be reduced. It has been hypothesized that frictional forces generated between a polishing pad and a substrate being polished leads to increased scratching and micro defects. However, the presence of additives intended to reduce frictional forces typically lead to agglomeration of abrasive particles, with a consequent increase in scratching and micro defects. Accordingly, there is a need in the art for polishing compositions exhibiting reduced scratching and micro defects and also exhibiting good surface topography and practicable removal rates.

BRIEF SUMMARY OF THE INVENTION

The invention provides a method of chemically-mechanically polishing a substrate, which method comprises (i) providing a substrate comprising at least one layer of nickel-phosphorous, (ii) providing a polishing pad, (iii) providing a polishing composition comprising (a) wet-process silica, (b) an oxidizing agent that oxidizes nickel-phosphorous, (c) a chelating agent, (d) polyvinyl alcohol, (e) water, wherein the polishing composition has a pH of about 1 to about 4, (iv) contacting a surface of the substrate with the polishing pad and the polishing composition, and (v) abrading at least a portion of the surface of the substrate to remove at least some nickel-phosphorous from the surface of the substrate and to polish the surface of the substrate.

The invention also provides a chemical-mechanical polishing composition comprising (a) wet-process silica, (b) an oxidizing agent that oxidizes nickel-phosphorous, (c) a chelating agent, (d) polyvinyl alcohol, wherein the polyvinyl alcohol has a molecular weight of about 8,000 g/mol to about 50,000 g/mol, (c) water, wherein the polishing composition has a pH of about 1 to about 4, and wherein the polishing composition does not comprise a heterocyclic compound.

DETAILED DESCRIPTION OF THE INVENTION

The invention provides a chemical-mechanical polishing composition comprising, consisting essentially of, or consisting of (a) wet-process silica, (b) an oxidizing agent that oxidizes nickel-phosphorous, (c) a chelating agent, (d) polyvinyl alcohol, wherein the polyvinyl alcohol has a molecular weight of about 8,000 g/mol to about 50,000 g/mol, (c) water, wherein the polishing composition has a pH of about 1 to about 4.

The polishing composition comprises wet-process silica particles (e.g., condensation-polymerized or precipitated silica particles). Preferably, the wet-process silica particles are condensation-polymerized silica particles. Condensation-polymerized silica particles typically are prepared by condensing $Si(OH)_4$ to form colloidal particles, where colloidal is defined as having an average particle size between about 1 nm and about 1000 nm. Such abrasive particles can be prepared in accordance with U.S. Pat. No. 5,230,833 or can be obtained as any of various commercially available products, such as the Akzo-Nobel Bindzil 50/80 product and the Nalco 1050, 1060, 2327, and 2329 products, as well as other similar products available from DuPont, Bayer, Applied Research, Nissan Chemical, Fuso, and Clariant. Other examples of suitable wet-process silica include but are not limited to XP320, XP442, CC-301, and CC401 (EKA, Mannheim, Germany), N1115, N8691, N1030C, and N8699 (supplied by Nalco Co., Naperville, Ill.), ST-N and ST-0 (Nissan Chemical America, Houston, Tex.), and Nexsil 20, 20A, 12, 8, and 5 (Nyacol Nano Technologies, Ashland, Mass.).

The silica particles can have any suitable average particle size (i.e., average particle diameter). The silica particles can have an average particle size of about 10 nm or more, e.g., about 15 nm or more, about 20 nm or more, or about 25 nm or more. Alternatively, or in addition, the silica can have an average particle size of about 80 nm or less, e.g., about 75 nm or less, about 70 nm or less, about 60 nm or less, about 50 nm or less, about 40 nm or less, or about 30 nm or less. Thus, the silica can have an average particle size bounded by any two of the above endpoints. For example, the silica can have an average particle size of about 10 nm to about 80 nm, about 10 nm to about 70 nm, about 10 nm to about 60 nm, about 10 nm to about 50 nm, about 10 nm to about 40 nm, about 10 nm to about 30 nm, about 20 nm to about 80 nm, about 20 nm to about 60 nm, about 20 nm to about 40 nm, or about 20 nm to about 30 nm.

The polishing composition can comprise any suitable amount of silica. Typically, the polishing composition can contain about 0.01 wt. % or more, e.g., about 0.05 wt. % or more, about 0.1 wt. % or more, about 0.5 wt. % or more, or about 1 wt. % or more of silica. Alternatively, or in addition, the polishing composition can contain about 10 wt. % or less, e.g., about 9 wt. % or less, about 8 wt. % or less, about 7 wt. % or less, about 6 wt. % or less, or about 5 wt. % or less of silica. Thus, the polishing composition can comprise silica in amounts bounded by any two of the above endpoints recited for silica. For example the polishing composition can comprise about 0.01 wt. % to about 10 wt. %, about 0.5 wt. % to about 10 wt. %, 1 wt. % to about 10 wt. %, 0.5 wt. % to about 10 wt. %, 0.5 wt. % to about 9 wt. %, 0.5 wt. % to about 8 wt. %, 0.5 wt. % to about 7 wt. %, 0.5 wt. % to about 6 wt. %, 0.5 wt. % to about 5 wt. %, or 1 wt. % to about 5 wt. % of silica.

The abrasive particles preferably are colloidally stable. The term colloid refers to the suspension of abrasive particles in the liquid carrier. Colloidal stability refers to the maintenance of that suspension through time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., {[B]−[T]}/[C]≤0.5). More preferably, the value of [B]−[T]/[C] is less than or equal to 0.3, and most preferably is less than or equal to 0.1.

The polishing composition comprises an oxidizing agent that oxidizes nickel-phosphorous. Preferred oxidizing agents are selected from the group consisting of hydrogen peroxide, urea hydrogen peroxide, peroxysulfuric acid, peroxyacetic acid, perboric acid, salts thereof, and combinations thereof. More preferably, the oxidizing agent is hydrogen peroxide. Typically, the polishing composition can contain about 0.5 wt. % or more, e.g., about 1 wt. % or more, or about 2 wt. % or more, of the oxidizing agent that oxidizes nickel-phosphorous. Alternatively, or in addition, the polishing composition can contain about 10 wt. % or less, e.g., about 8 wt. % or less, or about 6 wt. % or less, or about 4 wt. % or less, of the oxidizing agent that oxidizes nickel-phosphorous. Thus, the polishing composition can comprise silica in amounts bounded by any two of the above endpoints recited for the oxidizing agent that oxidizes nickel-phosphorous. For example the polishing composition can comprise about 0.5 wt. % to about 10 wt. %, or about 1 wt. % to about 8 wt. %, or about 2 wt. % to about 6 wt. % of the oxidizing agent that oxidizes nickel-phosphorous.

The polishing composition comprises a chelating agent. Desirably, the chelating agent is a chelating agent for nickel. The chelating agent can be any suitable chelating agent, especially any suitable chelating agent for nickel. The chelating agent preferably is chosen so that the polishing composition exhibits low dissolution behavior when in contact with a substrate comprising nickel-phosphorous. Non-limiting examples of suitable chelating agents include glycine and alanine. In a preferred embodiment, the chelating agent is glycine.

Typically, the polishing composition can contain about 0.1 wt. % or more, e.g., about 0.2 wt. % or more, or about 0.3 wt. % or more, or about 0.4 wt. % or more, or about 0.5 wt. % or more, of the chelating agent. Alternatively, or in addition, the polishing composition can contain about 2 wt. % or less, e.g., about 1.8 wt. % or less, or about 1.6 wt. % or less, or about 1.4 wt. % or less, or about 1.2 wt. % or less, or about 1 wt. % or less, of the chelating agent. Thus, the polishing composition can comprise the chelating agent in amounts bounded by any two of the above endpoints recited for the chelating agent. For example the polishing composition can comprise about 0.1 wt. % to about 2 wt. %, or about 0.2 wt. % to about 1.8 wt. %, or about 0.3 wt. % to about 1.6 wt. %, about 0.4 wt. % to about 1.4 wt. %, or about 0.5 wt. % to about 1.2 wt. % of the chelating agent.

The polishing composition comprises polyvinyl alcohol. The polyvinyl alcohol can be any suitable polyvinyl alcohol. In some embodiments, the polyvinyl alcohol has a molecular weight of about 8,000 g/mol or more, e.g., about 10,000 g/mol or more, about 12,000 g/mol or more, or about 13,000 g/mol or more. In some embodiments, alternatively, or in addition, the polyvinyl alcohol has a molecular weight of about 50,000 g/mol or less, e.g., about 45,000 g/mol or less, or about 40,000 g/mol or less, or about 35,000 g/mol or less, or about 30,000 g/mol or less, about 25,000 g/mol or less, or about 23,000 g/mol or less. Thus, in some embodiments, the polyvinyl alcohol has a molecular weight bounded by any two of the above endpoints recited for the polyvinyl alcohol. For example the polyvinyl alcohol can have a molecular weight of about 8,000 g/mol to about 50,000 g/mol, about 10,000 g/mol to about 45,000 g/mol, about 10,000 g/mol to about 40,000 g/mol, about 10,000 g/mol to about 35,000 g/mol, about 10,000 g/mol to about 30,000 g/mol, about 12,000 g/mol to about 25,000 g/mol, or about 13,000 g/mol to about 23,000 g/mol.

The polyvinyl alcohol can have any suitable degree of hydrolysis. Typically, polyvinyl alcohol has a degree of hydrolysis of about 90% or more, or about 92% or more, or about 94% or more, or about 96% or more, or about 98% or more. As is well known in the art, polyvinyl alcohol is typically prepared by hydrolysis of polyvinyl acetate. The degree of hydrolysis refers to the percentage of acetate groups in the polyvinyl acetate that have been hydrolyzed. In other words, the degree of hydrolysis refers to the percentage of free hydroxyl groups present in the polyvinyl alcohol.

Typically, the polishing composition can contain about 0.1 wt. % or more, e.g., about 0.2 wt. % or more, or about 0.3 wt. % or more, or about 0.4 wt. % or more, or about 0.5 wt. % or more, of polyvinyl alcohol. Alternatively, or in addition, the polishing composition can contain about 2 wt. % or less, e.g., about 1.8 wt. % or less, or about 1.6 wt. % or less, or about 1.4 wt. % or less, or about 1.2 wt. % or less, or about 1 wt. % or less, of polyvinyl alcohol. Thus, the polishing composition can comprise polyvinyl alcohol in amounts bounded by any two of the above endpoints recited for polyvinyl alcohol. For example the polishing composition can comprise about 0.1 wt. % to about 2 wt. %, or about 0.2 wt. % to about 1.8 wt. %, or about 0.3 wt. % to about 1.6 wt. %, or about 0.4 wt. % to about 1.4 wt. %, or about 0.5 wt. % to about 1.2 wt. % of polyvinyl alcohol.

Typically, the polishing composition has a pH of about 1 or more, e.g., about 2 or more, or about 3 or more. Alternatively, or in addition, the polishing composition has a pH of about 4 or less, e.g., about 3 or less, or about 2 or less. Thus, the polishing composition has a pH bounded by any two of the above endpoints recited for the pH of the polishing composition. For example, the polishing composition can have a pH of about 1 to about 4, about 1 to about 3, about 2 to about 4, about 3 to about 4, or about 1 to about 2.

In certain embodiments, the polishing composition does not comprise a heterocyclic compound. More particularly, the polishing composition substantially comprises less than about 100 ppb (parts per billion), e.g., less than about 75 ppb, or less than about 50 ppb, less than about 25 ppb, less than about 5 ppb, or less than about 1 ppb, of any heterocyclic compounds. In some embodiments, the polishing composition contains an undetectable amount of heterocycle compounds. In particular, heterocyclic compounds that complex with copper on the surface of a copper substrate to form an insoluble complex on the surface of the copper substrate are excluded from the polishing composition of the invention. Non-limiting examples of specific heterocyclic compounds that are excluded from the polishing composition of the invention include 5-aminotetrazole, imidazole, benzotriazole, benzimidazole, triazole, tolyltriazole, quinaldinic acid, quinolinic acid, amino compounds, imino compounds, carboxy compounds, mercapto compounds, nitro compounds, urea compounds, and thiourea compounds, and derivatives thereof. Desirably, the polishing composition does not contain any heterocyclic compounds.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., wet-process silica, oxidizing agent that oxidizes nickel-phosphorous, chelating agent, polyvinyl alcohol, etc.) as well as any combination of ingredients (e.g., wet-process silica, oxidizing agent that oxidizes nickel-phosphorous, chelating agent, polyvinyl alcohol, etc.).

For example, the wet-process silica can be dispersed in water. The chelating agent and polyvinyl alcohol can then be added, and mixed by any method that is capable of incorporating the components into the polishing composition. The oxidizing agent that oxidizes nickel-phosphorous can be added at any time during the preparation of the polishing composition. The polishing composition can be prepared prior to use, with one or more components, such as the oxidizing agent that oxidizes nickel-phosphorous, added to the polishing composition just before use (e.g., within about 1 minute before use, or within about 1 hour before use, or within about 7 days before use). The polishing composition also can be prepared by mixing the components at the surface of the substrate during the polishing operation.

The polishing composition can be supplied as a one-package system comprising wet-process silica, oxidizing agent that oxidizes nickel-phosphorous, chelating agent, polyvinyl alcohol, and water. Alternatively, the wet-process silica can be supplied as a dispersion in water in a first container, and chelating agent and polyvinyl alcohol can be supplied in a second container, either in dry form, or as a solution or dispersion in water. The oxidizing agent that oxidizes nickel-phosphorous desirably is supplied separately from the other components of the polishing composition and is combined, e.g., by the end-user, with the other components of the polishing composition shortly before use (e.g., 1 week or less prior to use, 1 day or less prior to use, 1 hour or less prior to use, 10 minutes or less prior to use, or 1 minute or less prior to use). The components in the first or second container can be in dry form while the components in the other container can be in the form of an aqueous dispersion. Moreover, it is suitable for the components in the first and second containers to have different pH values, or alternatively to have substantially similar, or even equal, pH values. Other two-container, or three or more-container, combinations of the components of the polishing composition are within the knowledge of one of ordinary skill in the art.

The polishing composition of the invention also can be provided as a concentrate which is intended to be diluted with an appropriate amount of water prior to use. In such an embodiment, the polishing composition concentrate can comprise the wet-process silica, chelating agent, polyvinyl alcohol, and water, with or without the oxidizing agent that oxidizes nickel-phosphorous, in amounts such that, upon dilution of the concentrate with an appropriate amount of water, and the oxidizing agent that oxidizes nickel-phosphorous if not already present in an appropriate amount, each component of the polishing composition will be present in the polishing composition in an amount within the appropriate range recited above for each component. For example, the wet-process silica, chelating agent, and polyvinyl alcohol can each be present in the concentration in an amount that is about 2 times (e.g., about 3 times, about 4 times, or about 5 times) greater than the concentration recited above for each component so that, when the concentrate is diluted with an equal volume of (e.g., 2 equal volumes of water, 3 equal volumes of water, or 4 equal volumes of water, respectively), along with the oxidizing agent that oxidizes nickel-phosphorous in a suitable amount, each component will be present in the polishing composition in an amount within the ranges set forth above for each component. Furthermore, as will be understood by those of ordinary skill in the art, the concentrate can contain an appropriate fraction of the water present in the final polishing composition in order to ensure that other components are at least partially or fully dissolved in the concentrate.

The invention also provides a method of chemically-mechanically polishing a substrate with the polishing composition described herein. In particular, the inventive method comprises (i) contacting a substrate with a polishing pad and the chemical-mechanical polishing composition described herein, (ii) moving the polishing pad relative to the substrate with the chemical-mechanical polishing composition therebetween, and (iii) abrading at least a portion of the substrate to polish the substrate.

The substrate to be polished using the method of the invention can be any suitable substrate, especially a substrate that contains nickel-phosphorous. A preferred substrate comprises at least one layer, especially an exposed layer for polishing, comprising, consisting essentially of, or consisting of nickel-phosphorous. Particularly suitable substrates include, but are not limited to, memory or rigid disks, such as aluminum disks coated with nickel-phosphorous.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

A substrate can be planarized or polished with the chemical-mechanical polishing composition with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

A chemical-mechanical polishing process can be characterized in a number of ways, such as in terms of the removal rate of a substrate, the resulting surface roughness, and the resulting edge roll-off of a substrate.

The removal rate of a substrate can be determined using any suitable technique. Examples of suitable techniques for determining the removal rate of a substrate include weighing the substrate before and after use of the inventive polishing method to determine the amount of substrate removed per unit of polishing time, which can be correlated with the removal rate in terms of thickness of substrate removed per unit of polishing time, and determining the thickness of the substrate before and after use of the inventive polishing method to directly measure the removal rate of the substrate per unit of polishing time.

One measure of defectivity is the total scratch count as defined as the sum of shallow, micro, and deep scratches on the surface of a substrate after polishing. Another measure of defectivity is the count of micro particles that either adhere to the surface or are embedded in the surface of a substrate that has been polished. The substrate, such as a nickel-phosphorous coated memory disk, can be inspected using optical defect scanning equipment such as the Candela 6100 and 6300 series and similar instruments available from KLA Tencor (Milpitas, Calif.).

Desirably, the inventive polishing composition and method disclosed herein result in reduction in the total scratch count and/or in the count of micro particles when used to polish substrates comprising a nickel-phosphorous coated memory disk.

The following example further illustrates the invention but, of course, should not be construed as in any way limiting its scope.

EXAMPLE

This example demonstrates the effect on defectivity achievable by the inventive polishing composition in the polishing of nickel-phosphorous-coated aluminum memory disks.

Similar substrates comprising nickel-phosphorous-coated aluminum memory disks were separately polished on one side with four different polishing compositions. Each of the polishing compositions comprised 5 wt. % of a wet-process silica having an average particle size of ≤30 nm, 1 wt. % glycine, and 0.6 wt. % hydrogen peroxide in water at a pH of 1.9. Polishing Composition A (control) did not contain any polyvinyl alcohol. Polishing Compositions B, C, and D further comprised 250 ppm, 500 ppm, and 1000 ppm of a polyvinyl alcohol, respectively, wherein the polyvinyl alcohol had a molecular weight in the range of 13,000-23,000 g/mol and a degree of hydrolysis of about 98%.

Following polishing, the substrates were examined for total scratch counts, shallow scratch counts, deep scratch counts, micro scratch counts, and micro particle counts, wherein micro particle counts refers to particles adhered to or imbedded in the substrate surface. The results are set forth in the Table.

TABLE

| Composition | A* (control) | B (invention) | C (invention) | D (invention) |
|---|---|---|---|---|
| Total scratch count | 56 | 7 | 12 | 7 |
| Shallow scratch count | 30 | 5 | 5 | 4 |
| Deep scratch count | 5 | 1 | 1 | 1 |
| Micro scratch count | 22 | 2 | 6 | 3 |
| Micro particle count | 925 | 906 | 584 | 485 |

*average of two experiments

As is apparent from the results set forth in the Table, the inventive polishing compositions B-D exhibited approximately 79-88% reductions in the total scratch count, approximately 83-87% reductions in the shallow scratch count, approximately 80% reductions in the deep scratch count, and approximately 73-91% reductions in the micro scratch count, compared to the control polishing composition A. Inventive polishing compositions C and D, which contained 500 ppm and 1000 ppm, respectively, of polyvinyl alcohol, exhibited approximately 38% and 48% reductions in the micro particle count compared to control polishing composition A.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A method of chemically-mechanically polishing a memory or rigid disk substrate, which method comprises:
   (i) providing a memory or rigid disk substrate comprising at least one layer of nickel-phosphorous,
   (ii) providing a polishing pad,
   (iii) providing a polishing composition comprising:
       (a) wet-process silica,
       (b) an oxidizing agent that oxidizes nickel-phosphorous,
       (c) a chelating agent,
       (d) polyvinyl alcohol, wherein the polyvinyl alcohol has a degree of hydrolysis of about 90% or more,
       (e) water,
   wherein the polishing composition has a pH of about 1 to about 4,
   (iv) contacting a surface of the substrate with the polishing pad and the polishing composition, and
   (v) abrading at least a portion of the surface of the substrate to remove at least some nickel-phosphorous from the surface of the substrate and to polish the surface of the substrate.

2. The method of claim 1, wherein the polishing composition comprises about 1 wt. % to about 10 wt. % of wet-process silica.

3. The method of claim 1, wherein the oxidizing agent is hydrogen peroxide.

4. The method of claim 1, wherein the chelating agent is glycine or alanine.

5. The method of claim 1, wherein the polishing composition comprises about 0.1 wt. % to about 2 wt. % of the chelating agent.

6. The method of claim 1, wherein the polyvinyl alcohol has a degree of hydrolysis of about 98% or more.

7. The method of claim 1, wherein the polishing composition comprises about 0.1 wt. % to about 2 wt. % of polyvinyl alcohol.

8. The method of claim 1, wherein the polishing composition has a pH of about 1 to about 3.

9. The method of claim 1, wherein the substrate is a nickel-phosphorous-coated aluminum disk.

10. The method of claim 1, wherein the wet-process silica has an average particle size of about 10 nm to about 80 nm.

11. The method of claim 10, wherein the wet-process silica has an average particle size of about 10 nm to about 30 nm.

12. The method of claim 1, wherein the polyvinyl alcohol has a molecular weight of about 8,000 g/mol to about 50,000 g/mol.

13. The method of claim 12, wherein the polyvinyl alcohol has a molecular weight of about 13,000 g/mol to about 23,000 g/mol.

14. A method of chemically-mechanically polishing a memory or rigid disk substrate, which method comprises:
   (i) providing a memory or rigid disk substrate,
   (ii) providing a polishing pad,
   (iii) providing the polishing composition comprising:
       (a) wet-process silica,
       (b) an oxidizing agent that oxidizes nickel-phosphorous,
       (c) a chelating agent,
       (d) polyvinyl alcohol, wherein the polyvinyl alcohol has a molecular weight of about 8,000 g/mol to about 50,000 g/mol,
       (e) water,
   wherein the polishing composition has a pH of about 1 to about 4, and wherein the polishing composition does not comprise a heterocyclic compound,
   (iv) contacting a surface of the substrate with the polishing pad and the polishing composition, and
   (v) abrading at least a portion of the surface of the substrate to remove at least some portion of the surface of the substrate so as to polish the surface of the substrate.

* * * * *